(12) United States Patent
Nall et al.

(10) Patent No.: US 7,915,061 B2
(45) Date of Patent: Mar. 29, 2011

(54) ENVIRONMENTALLY ROBUST LIGHTING DEVICES AND METHODS OF MANUFACTURING SAME

(75) Inventors: Jeffrey Marc Nall, Brecksville, OH (US); Srinath K. Aanegola, Broadview Heights, OH (US); Koushik Saha, Brunswick, OH (US); Xin Wang, Shanghai (CN); Kevin Carpenter, Shaker Heights, OH (US)

(73) Assignee: GE Lighting Solutions, LLC, Cleveland, OH (US)

( * ) Notice: Subject to any disclaimer, the term of this patent is extended or adjusted under 35 U.S.C. 154(b) by 218 days.

(21) Appl. No.: 12/129,925

(22) Filed: May 30, 2008

(65) Prior Publication Data

US 2008/0296607 A1 Dec. 4, 2008

Related U.S. Application Data

(60) Provisional application No. 60/932,394, filed on May 31, 2007.

(51) Int. Cl.
*H01L 21/00* (2006.01)
(52) U.S. Cl. .......................................... 438/26; 438/27
(58) Field of Classification Search .................. 438/26, 438/27
See application file for complete search history.

(56) References Cited

U.S. PATENT DOCUMENTS

| | | | |
|---|---|---|---|
| 4,667,481 A | 5/1987 | Watanabe et al. |
| 5,890,794 A | 4/1999 | Abtahi et al. |
| 6,619,831 B2 | 9/2003 | Kanesaka |
| 6,903,380 B2 | 6/2005 | Barnett et al. |
| 6,909,234 B2 | 6/2005 | Chen |
| 7,156,538 B2 | 1/2007 | Han et al. |
| 7,166,868 B2 | 1/2007 | Wu |

(Continued)

OTHER PUBLICATIONS

3M Graphics Market Center, "Translucent Graphic Film Series 3630," Product Bulletin 3630, Release J, pp. 1-6, (2006).

(Continued)

*Primary Examiner* — N Drew Richards
*Assistant Examiner* — Grant S Withers
(74) *Attorney, Agent, or Firm* — Fay Sharpe LLP

(57) ABSTRACT

An illustrative lighting device comprises: a light emitting chip; a silicone encapsulant disposed over the light emitting chip; and a light transmissive vinyl or acrylic layer sealing an assembly including at least the silicone encapsulant and the light emitting chip. An illustrative method of fabricating a lighting device comprises: encapsulating a light emitting chip with a silicone encapsulant; and sealing an assembly including at least the silicone encapsulant and the light emitting chip using a light transmissive vinyl or acrylic layer. An illustrative method of fabricating a lighting device comprises: encapsulating a light emitting chip with a silicone encapsulant; and sealing an assembly including at least the silicone encapsulant and the light emitting chip by disposing a light transmissive plastic layer as a unit over the assembly.

15 Claims, 3 Drawing Sheets

U.S. PATENT DOCUMENTS

| | | | |
|---|---|---|---|
| 2003/0141510 A1* | 7/2003 | Brunner et al. | 257/81 |
| 2004/0241894 A1 | 12/2004 | Nagai | |
| 2005/0001230 A1* | 1/2005 | Takekuma | 257/100 |
| 2005/0173721 A1* | 8/2005 | Isoda | 257/99 |
| 2005/0221518 A1* | 10/2005 | Andrews et al. | 438/27 |
| 2005/0221519 A1* | 10/2005 | Leung et al. | 438/27 |
| 2005/0239227 A1 | 10/2005 | Aanegola et al. | |
| 2006/0006793 A1 | 1/2006 | Baroky | |
| 2006/0060867 A1 | 3/2006 | Suehiro | |
| 2006/0065906 A1* | 3/2006 | Harada | 257/98 |
| 2006/0099449 A1 | 5/2006 | Amano | |
| 2007/0010157 A1* | 1/2007 | Sorg | 445/25 |
| 2007/0194336 A1* | 8/2007 | Shin et al. | 257/98 |
| 2007/0241357 A1* | 10/2007 | Yan | 257/98 |
| 2008/0026498 A1* | 1/2008 | Tarsa et al. | 438/26 |
| 2008/0035942 A1* | 2/2008 | Kim et al. | 257/98 |
| 2008/0054285 A1* | 3/2008 | Park | 257/98 |
| 2008/0073662 A1* | 3/2008 | Wang et al. | 257/99 |
| 2009/0162957 A1* | 6/2009 | Joung | 438/27 |

OTHER PUBLICATIONS

3M Graphics Market Center, "Translucent Graphic Film IJ3630-20, RG3630-20 and FN3630-20," Product Bulletin PIJ3630, Release B, pp. 1-7, (2006).

3M Graphics Market Center, "Translucent Film Series 3632GPS," Product Bulletin 3632, Release F, pp. 1-5, (2005).

Search Report from PCT/US2008/065308.

* cited by examiner

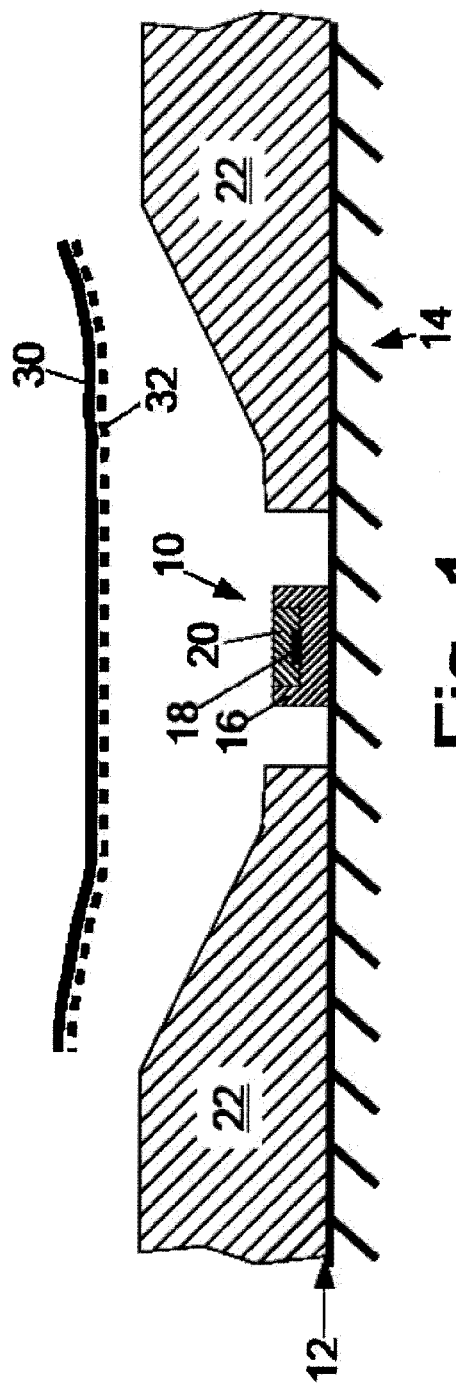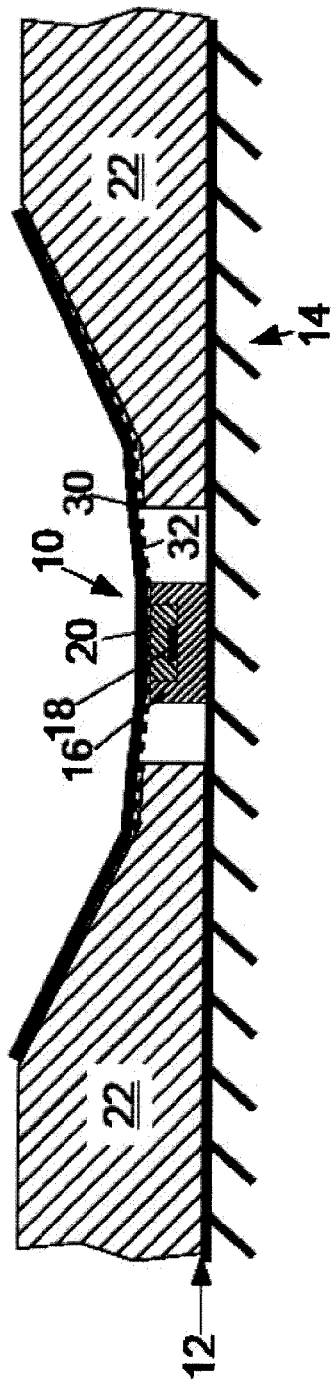

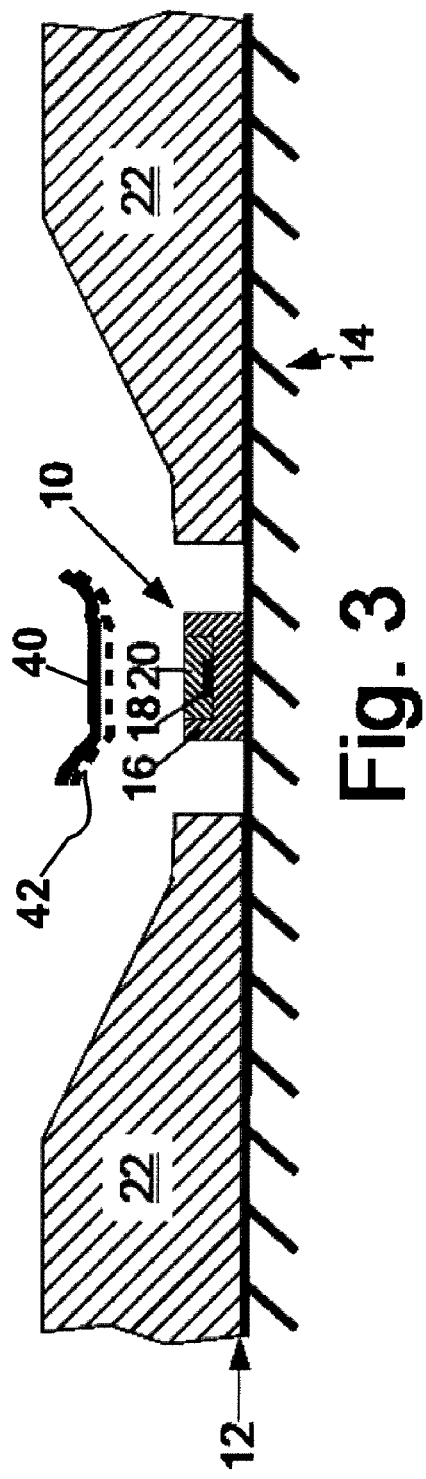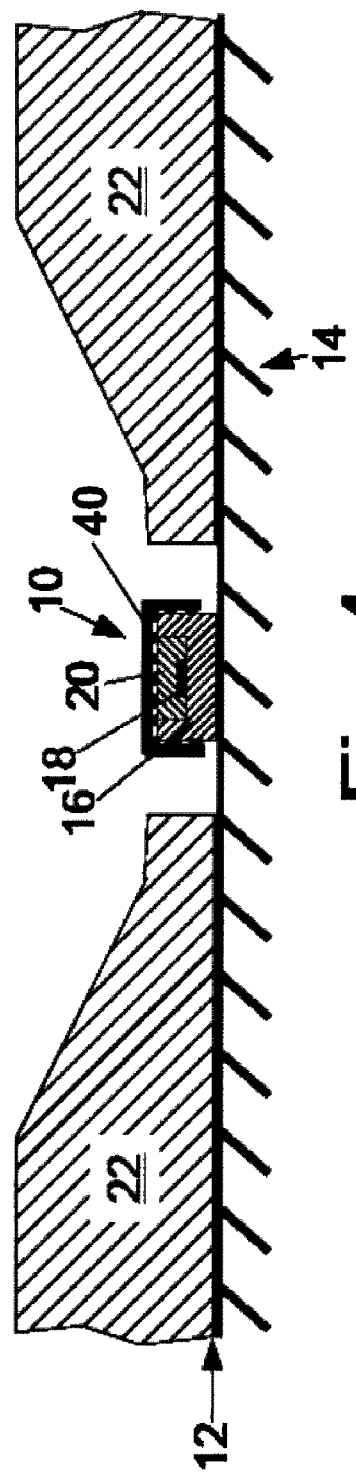

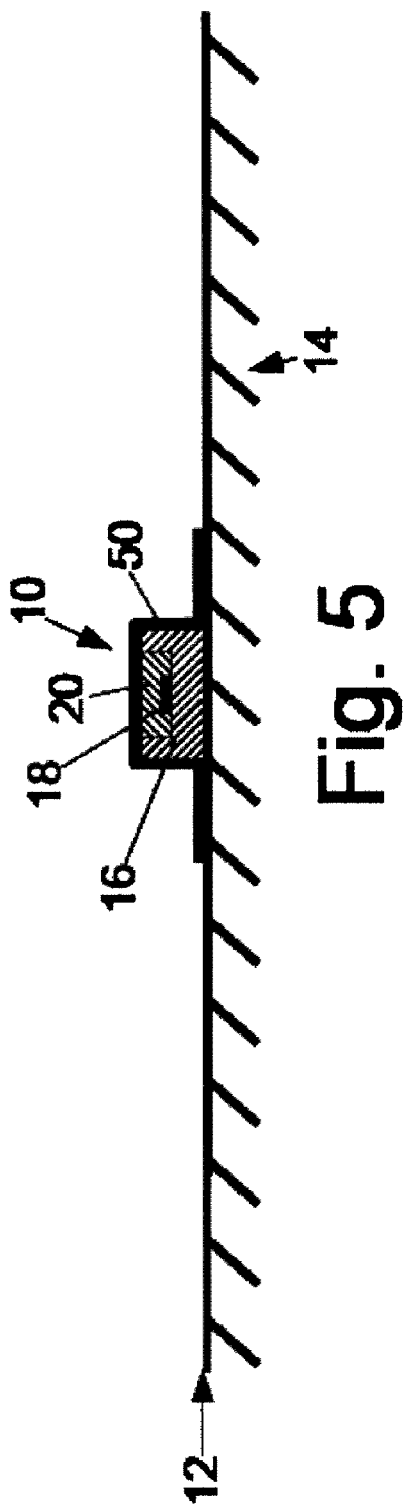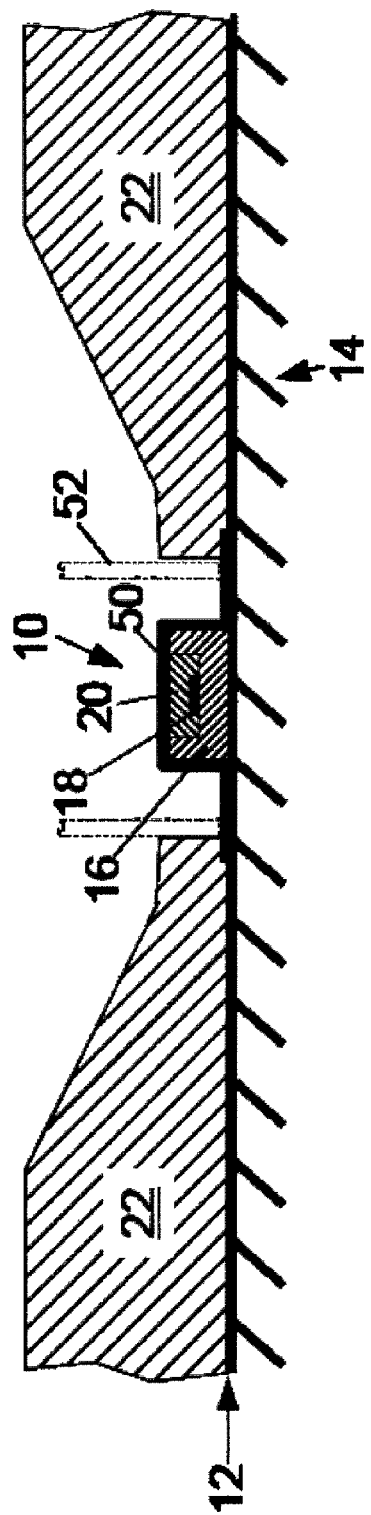

ENVIRONMENTALLY ROBUST LIGHTING DEVICES AND METHODS OF MANUFACTURING SAME

This application claims the benefit of U.S. Provisional Application No. 60/932,394 filed May 31, 2007. U.S. Provisional Application No. 60/932,394 filed May 31, 2007 and entitled "ENVIRONMENTALLY ROBUST LIGHTING DEVICES AND METHODS OF MANUFACTURING SAME" is incorporated herein by reference in its entirety.

BACKGROUND

The following relates to the optoelectronic arts. It finds particular application in outdoor illumination using light emitting diodes. However, the following will find more general application in conjunction with illumination generally.

Light emitting diodes are rapidly gaining market share, especially for outdoor lighting applications where their improved robustness against environmental damage and longer operating lifetimes are distinct advantages compared with incandescent and fluorescent light sources. Some rigorous environments in which light emitting diodes have found application include outdoor backlit signage, exterior architecture lighting, illuminated outdoor advertisements, traffic signals, and so forth.

In a common embodiment, the light emitting diode includes a semiconductor light emitting diode chip comprising a layered structure including group III-nitride layers that emits in the blue, violet or ultraviolet, optically coupled with a phosphor or phosphor blend that downconverts some or all of the blue, violet, or ultraviolet emission. In some embodiments, a white emitting phosphor blend is used, and the light emitting diode is designed so that most or all of the chip emission is converted to white by the phosphor blend. In other embodiments, the phosphor or phosphor blend emits yellow, red, or other relatively longer wavelength light that blends with blue or violet chip emission to produce white light. Other materials besides group III-nitrides can be used to fabricate the light emitting chip, and some light emitting diodes output the chip radiation directly without downconversion by a phosphor.

In a usual configuration, the light emitting diode chip is encapsulated by a transparent encapsulant, and the phosphor or phosphor blend is disposed on the chip, dispersed in the encapsulant, disposed on top of the encapsulant, or otherwise arranged to receive and downconvert the chip emission. The encapsulant provides environmental protection, provides a substrate or matrix for supporting the phosphor or phosphor blend, and optionally acts as a refractive or diffractive optical element, for example by being formed into a lens.

Epoxy is a known transparent encapsulant material suitable for use in light emitting diodes. However, typical epoxies have been found to degrade in the presence of the operating light emitting diode chip. The degradation manifests as a "browning" or other discoloration of the epoxy, which acts as a light absorber and substantially reduces light output efficiency. This degradation is particularly problematic when the chip emits in the violet or ultraviolet range, although epoxy degradation due to longer wavelength emission and or heating caused by the operating chip is also of concern.

Another known transparent encapsulant is silicone, which shows greater robustness to exposure to an operating light emitting diode chip, and generally does not "brown" or otherwise discolor over time in such an environment. However, silicone does not provide an effective hermetic sealing of the encapsulated light emitting diode chip. This lack of hermetic sealing can lead to environmental exposure of the chip, lead frame, or other components. As a result, light emitting diodes employing silicone encapsulation have lower yield during manufacturing due to higher impact on the chip of processes such as reflow soldering, and are expected to have higher failure rates when used outdoors or in other rigorous environments. The limited sealing ability of silicone is particularly problematic in surface mount light emitting diodes in which the chip is mounted to a circuit board directly or via the intermediary of a small slug or other submount. In such devices, sealing the gap or interface between the circuit board and the chip is especially problematic.

In another approach, a transparent silicone encapsulant is used, and a conformal spray coating is applied over the silicone. The spray coating can provide additional sealing, but is prone to lower yields and reliability problems due to non-uniformities sometimes observed in spray coatings. Such spray coatings sometimes have small voids, holes, thin regions, or so forth that compromise the intended hermetic sealing. Epoxy spray coatings are expected to be less prone to degradation due to the separation from the chip—however, degradation of the epoxy spray coating is nonetheless sometimes observed. Silicone spray coatings suffer from the same deficiencies as the silicone encapsulant itself, and accordingly typically provide less than ideal hermetic sealing.

In another approach, a separate enclosure or cover is provided. For example, Aanegola et al., U.S. Publ. Appl. 2005/0239227 A1, discloses a surface mount light emitting diode disposed on a circuit board and encapsulated by silicone, over which is placed a dome-shaped cover of glass or another transparent material. In some disclosed embodiments, the dome-shaped cover is hermetically sealed with the circuit board. A phosphor or phosphor blend may be disposed on the dome-shaped cover, in the silicone, or over the chip. This approach has numerous advantages.

However, placement of the dome-shaped cover over the silicone encapsulant and sealing of the cover to the circuit board adds manufacturing complexity. Thermal expansion or contraction due to large outdoor temperature changes can produce overpressure or underpressure in the sealed volume defined by the circuit board and the dome-shaped cover. Other enclosure or covering approaches such as covering by a separate lensing element, enclosure in a sealed traffic light housing, or so forth similarly add manufacturing complexity and raise the possibility of temperature-related overpressures or underpressures. The enclosure or cover also does not provide protection against damage during reflow soldering or other manufacturing processes that may precede addition of the cover or enclosure.

BRIEF SUMMARY

In an illustrative lighting device disclosed herein as an illustrative example, a lighting device comprises: a light emitting chip; and a light transmissive vinyl or acrylic layer sealing an assembly including at least the light emitting chip. Optionally, the lighting device further includes an encapsulant disposed over the light emitting chip, the assembly sealed by the light transmissive vinyl or acrylic layer further including the encapsulant.

In an illustrative method disclosed herein as an illustrative example, a method of fabricating a lighting device comprises: encapsulating a light emitting chip with a silicone encapsulant; and sealing an assembly including at least the silicone encapsulant and the light emitting chip using a light transmissive vinyl or acrylic layer.

In an illustrative method disclosed herein as an illustrative example, a method of fabricating a lighting device comprises: encapsulating a light emitting chip with a silicone encapsulant; and sealing an assembly including at least the silicone encapsulant and the light emitting chip by disposing a light transmissive plastic layer as a unit over the assembly.

BRIEF DESCRIPTION OF THE DRAWINGS

The invention may take form in various components and arrangements of components, and in various process operations and arrangements of process operations. The drawings are only for purposes of illustrating preferred embodiments and are not to be construed as limiting the invention. Unless otherwise indicated, the drawings are not to scale.

FIG. 1 diagrammatically illustrates a portion of a lighting device in the process of being fabricated, including a surface mount light emitting diode package disposed on an overmolded substrate and a light transmissive plastic sheet positioned above the light emitting diode package for installation.

FIG. 2 diagrammatically illustrates the portion of the lighting package of FIG. 1 after hermetic sealing of the light emitting diode package and a surrounding portion of the overmolded substrate.

FIG. 3 diagrammatically illustrates a portion of a lighting device in the process of being fabricated, including a surface mount light emitting diode package disposed on an overmolded substrate and a light transmissive plastic sheet positioned above the light emitting diode package for installation.

FIG. 4 diagrammatically illustrates the portion of the lighting package of FIG. 3 after hermetic sealing of the light emitting diode package.

FIG. 5 diagrammatically illustrates a portion of a lighting device in the process of being fabricated, including a surface mount light emitting diode package disposed on a substrate and a light transmissive plastic sheet disposed over the surface mounted light emitting diode package. Portions of isolation pin of an overmold die are shown in phantom extending to contact the light transmissive plastic sheet.

FIG. 6 diagrammatically illustrates the portion of the lighting package of FIG. 5 after overmolding. The portions of the isolation pin of the overmold die used to isolate the light emitting diode package are again shown in phantom.

DETAILED DESCRIPTION OF PREFERRED EMBODIMENTS

With reference to FIGS. 1 and 2, a surface mount light emitting diode package 10 is mounted to a surface 12 of a substrate 14 configured to convey operative electrical power to the light emitting chip. For example, the substrate 14 in some embodiment is a printed circuit board. The light emitting diode package 10 includes a lead frame or submount 16 configured to support a light emitting diode chip 18. A silicone encapsulant 20 is disposed over the light emitting diode chip 18. Forming the encapsulant 20 of a material other than silicone is also contemplated.

In some embodiments, the light emitting diode chip 18 may include a group III-nitride layer structure defining a light emitting diode junction. In some embodiments, the light emitting diode chip 18 may be configured to emit light with a peak wavelength in the blue, violet, or ultraviolet region—for example, group III-nitride and silicon carbide based light emitting diodes suitably emit light with a peak wavelength in the blue, violet, or ultraviolet region. In some embodiments, a phosphor or phosphor blend is disposed in, under, or over the silicone encapsulant 20, the phosphor or phosphor blend being configured to downconvert at least a substantial portion of light generated by the light emitting chip. For example, the light emitting diode chip 18 may be configured to emit light with a peak wavelength in the blue, violet, or ultraviolet region, and the phosphor or phosphor blend may include primary color phosphor components that cooperatively downconvert most or all of the emitted light to white or approximately white light. In other embodiments, the light emitting diode chip 18 may be configured to emit light with a peak wavelength in the blue region, and the phosphor or phosphor blend may include yellow, orange, or other components that downconvert a portion, but not all, of the emitted light such that the combination of unconverted direct blue light and downconverted longer wavelength light approximates white light. It is also contemplated to incorporate such a phosphor or phosphor blend directly into the light emitting diode chip 18, for example in a light transmissive substrate or as a coating including the phosphor or phosphor blend. Still further, the light emitting diode chip 18 is contemplated to be an organic light emitting diode chip. While only a single light emitting diode chip 18 is shown in the illustrated light emitting diode package 10, it is contemplated to have a surface mount light emitting diode package or other light emitting diode package in which two, three, or more light emitting diode chips are commonly encapsulated by an encompassing silicone encapsulant. For example, a single light emitting diode package may include red-emitting, blue-emitting, and green-emitting light emitting chips selectively energizable to generate various colors or combinations of colors. Further, while only a single light emitting diode package 10 is illustrated, it is to be appreciated that the lighting device may include one, two, three, four, five, ten, twenty, fifty, or substantially any number of light emitting diode packages, which may all be the same, or all different, or various combinations of the same and different light emitting diode packages.

An overmolding 22 is disposed over at least a portion of the surface 12 of the substrate 14, but not over the light emitting package 10. In some embodiments, the overmolding 22 substantially encases the substrate 14 except for openings for the light emitting diode package 10, and for any other additional light emitting diode packages (not shown). In other embodiments, a lesser portion of the substrate is overmolded. In yet other embodiments, the overmolding 22 is optionally formed by potting or another substrate sealing process (or partial substrate sealing process). In some embodiments in which the overmolding 22 is included, the overmolding 22 is formed by injection overmolding. In some embodiments, the overmolding 22 is made of a polyvinyl chloride (PVC) material, although other potting or overmolding materials can be used.

The silicone encapsulant 20 of the light emitting diode package 10 advantageously provides mechanical sealing of the light emitting diode chip 18, and also provides some protection from water and other contaminants. Moreover, the silicone encapsulant 20 suitably serves as a host material for a phosphor or phosphor blend, if included in the light emitting diode package 10, or suitably serves as a spacer to separate the phosphor or phosphor blend from the light emitting diode package 10. However, the silicone encapsulant 20 does not provide a wholly satisfactory hermetic sealing of the encapsulated light emitting diode chip 18. Accordingly, there may be some environmental exposure of the light emitting diode chip 18, portions of the lead frame or submount 16, or other components. For example, sulfur or certain sulfur-containing compounds, and moisture are two environmental contaminants that are believed to have a tendency to lead to lower manufacturing yields, premature failure, or increased failure rates in lighting devices. The optional overmolding 22 provides substantial sealing of the substrate 14 (or of overmolded portions of the substrate 14), but the light emitting diode package 10 of FIGS. 1 and 2 is not covered by the overmolding. In some embodiments, the overmolding 22 is substantially opaque respective to light output by the light emitting diode package 10, which precludes overmolding the light emitting diode package 10. Even if the overmolding 22 is translucent or transmissive for light output by the light emitting diode package 10, it may be advantageous to avoid overmolding the light emitting diode package 10 to avoid light attenuation, light scattering, light diffraction, or other optical effects that may be deemed undesirable.

In the embodiment of FIG. 1, a plastic sheet 30 is disposed over an assembly including at least the silicone encapsulant 20 and the light emitting chip 18, and optionally over additional components such as a portion of the surface 12 of the substrate 14 and a surrounding portion of the overmolding 22. The plastic sheet 30 is suitably made of an ultraviolet-resistant material in the case in which the light emitting chip 18 emits some, mostly, or all ultraviolet light. Some suitable ultraviolet-resistant materials include vinyl and acrylic. Other contemplated plastic materials suitable for the plastic sheet 30 include polycarbonate or polyethylene. The plastic sheet 30 should have a thickness sufficient to provide environmental protection, but is advantageously thin to reduce light absorption. A 2-4 mil sheet (i.e., sheet thickness of less than or about one-tenth of a millimeter) of vinyl or acrylic is expected to absorb less than or about six percent of light generated by the assembly, while providing suitable environmental protection. The use of thicker plastic sheets is also contemplated. In some embodiments, the plastic sheet 30 is a portion of 3M™ Scotchcal™ translucent vinyl (available from 3M, St. Paul, Minn., USA) which includes a suitable acrylic adhesive 32. Other adhesives, such as various "superglues" can also be used. The adhesive 32 is also substantially light transmissive.

In the embodiment of FIGS. 1 and 2, the plastic sheet 30 is provided as a unit, i.e. as a standalone sheet of vinyl or acrylic with the adhesive 32 on a side adjacent to the assembly, as shown in FIG. 1. The plastic sheet 30 is disposed over the assembly which includes, as seen in FIG. 2, the light emitting chip 18 disposed in the lead frame or submount 16 and encapsulated in silicone 20, and surrounding portions of the surface 12 of the substrate 14 with overmolding 22.

With reference to FIGS. 3 and 4, in an alternative embodiment, a plastic sheet 40 that is smaller in area and again coated on one side with adhesive 42 is suitably used. The plastic sheet 40 is disposed over the assembly which includes, as seen in FIG. 4, the light emitting chip 18 disposed in the lead frame or submount 16 and encapsulated in silicone 20. The smaller plastic sheet 40 does not cover any surrounding portions of the surface 12 of the substrate 14 with overmolding 22.

In the embodiments of FIGS. 1-4, the plastic sheet 30, 40 is sufficiently flexible to substantially conformally cover the silicone encapsulant 20 and, in the case of the embodiment of FIGS. 1 and 2, the plastic sheet 30 is sufficiently flexible to substantially conformally cover the surrounding overmolding 22 including the illustrated depressed surrounding region of overmolding 22.

In the embodiment of FIGS. 1 and 2, the plastic sheet 30 does not "fill in" the gaps between the surface mount light emitting diode package 10 and the surrounding overmolding 22. However, the plastic sheet 30 in conjunction with the adhesive 32 forms a hermetic seal with the surrounding overmolding 22, and the overmolding 22 in turn forms a hermetic seal with the surface 12 of the substrate 14. Accordingly, the surface mounted light emitting diode package 10 is hermetically sealed by the combination of the plastic sheet 30 and adhesive 32 and the overmolding 22.

In the embodiments of FIGS. 1-4, the plastic sheet 30, 40 of vinyl, acrylic, polycarbonate, polyethylene, or another environmentally resistant plastic is disposed as a unit. In other words, the plastic sheet is provided as a free-standing sheet portion that is adhered to the silicone 20 and optionally to surrounding components such as the lead frame or submount 16 or the surrounding overmolding 22. This approach has certain advantages. It enables use of existing sources of thin vinyl or acrylic sheeting with adhesive having thicknesses of less than or about one-tenth of a millimeter such as 3M™ Scotchcal™ translucent vinyl sheeting. Such commercial vinyl or acrylic sheeting tends to be substantially free (at least on the size scale of the light emitting diode package 10) of microvoids, pinholes, or other structural defects that if present may compromise the integrity of the environmental sealing. In comparison, spray coating or other layer deposition or other piecemeal deposition techniques are typically more prone to exhibiting pinholes, microvoids, or other structural defects. Still further, commercially available vinyl or acrylic sheeting is known for macroscopic use in signage, e.g. to cover the face of an outdoor sign, and accordingly is available with various optical finishes or features such as light diffusing finishes, color filtering, prismatic light spreading effects, and so forth.

The illustrated sheets 30, 40 have adhesive 32, 42 pre-applied to the sheet. This arrangement has certain advantages, and some commercial vinyl or acrylic sheeting such as 3M™ Scotchcal™ translucent vinyl sheeting come with such adhesive provided. However, more generally the adhesive can be on the plastic sheet, or can be applied preferentially in areas on the surface 12 of the substrate 14, or on the overmolding 22, or on the exposed surface of the silicone encapsulant 20, or so forth.

As noted with reference to FIGS. 1-4, the applied plastic sheet 30, 40 can be of varying size. Vinyl, acrylic, or other plastic materials in thin sheet form are typically readily die-cut into the desired shape and size for disposal over the light emitting diode package 10.

Although the disposing of the vinyl, acrylic, or other plastic layer as a unit is preferred, it is also contemplated to dispose a vinyl, acrylic, or other ultraviolet-resistant layer in place of the sheets 30, 40 using spray coating or another deposition technique such that the layer is not disposed over the assembly as a unit.

As noted previously, in some embodiments a phosphor or phosphor blend may be disposed in, under, or over the silicone encapsulant 20, the phosphor or phosphor blend being configured to downconvert at least a substantial portion of light generated by the light emitting chip. In some such embodiments, it is contemplated to have the phosphor or phosphor blend disposed in or on the plastic sheet 30, 40, or in or on the adhesive 32, 42.

In the embodiment of FIGS. 1 and 2, the manufacturing sequence includes performing the overmolding first, followed by disposing the sheet 30 over the assembly such that the adhesive 32 bonds the sheet 30 to the silicone encapsulant 20 and to the surrounding overmolding 22, as well as optionally to exposed portions of the lead frame or submount 16. In the embodiment of FIGS. 3 and 4, the sheet 40 does not extend over any portion of the overmolding 22. Accordingly, for the embodiment of FIGS. 3 and 4 the manufacturing sequence can involve adhering the sheet 40 to the light emitting diode package 10 either before or after the overmolding 22 is applied. Indeed, the sheet 40 can be adhered to the light emitting diode package 10 either before or after the light emitting diode package 10 is mounted to the surface 12 of the substrate 14.

With reference to FIG. 5, another embodiment is disclosed. In this embodiment, the conformable plastic sheet 30, 40 of previous embodiments is replaced by a substantially rigid vinyl, clear acrylic, or other light-transmissive plastic cap 50 shaped and sized to receive the surface mounted light emitting diode package 10 and seal against the surface 12 of the substrate 14. In this embodiment, the substantially rigid plastic cap 50 defines a light transmissive plastic layer that is disposed as a unit over an assembly including at least the silicone encapsulant 20 and the light emitting chip 18 to hermetically seal the assembly. Although not shown, in some embodiments an adhesive may be disposed between the plastic cap 50 and the surface mounted light emitting diode package 10, or between the plastic cap 50 and the surface 12 of the substrate 14, or both between the plastic cap 50 and the surface mounted light emitting diode package 10 and between the plastic cap 50 and the surface 12 of the substrate 14. The illustrated plastic cap 50 has a flat top extending over the surface mounted light emitting diode package 10, which advantageously tends to introduce little or no diffraction or refraction of the light. However, it is also contemplated to use a dome-shaped or otherwise-shaped cap.

By having the edges of the plastic cap 50 seal against the surface 12 of the substrate 14 surrounding the light emitting diode package 10, hermetic sealing of the light emitting diode package 10 is suitably achieved. In some contemplated embodiments, the structure shown in FIG. 5 is the complete structure.

With continuing reference to FIG. 5 and with further reference to FIG. 6, in some embodiments the structure of FIG. 5 is an intermediate stage of manufacturing, which is followed by overmolding. In these embodiments, the overmolding 22 is disposed over at least a portion of the surface 12 of the substrate 14 and over a periphery of the vinyl or acrylic cap 50. In such a configuration, the periphery of the plastic cap 50 suitably defines a gasket against which an annular isolation pin 52 (shown in phantom in FIG. 6) presses during the injection overmolding, potting, or other overmolding process. The annular isolation pin 52 defines a cavity that receives the light emitting diode package 10 during injection overmolding. The annular pin 52 surrounds the light emitting diode package 10, and the periphery of the plastic cap 50 defines a gasket against which the bottom of the annular isolation pin 52 presses to seal off the interior volume of the annular pin 52. As a result, as seen in FIG. 6 the injected overmolding 22 covers the surface 12 of the substrate 14 up to the exterior of the annular pin 52, but does not inject further into the sealed interior volume of the annular pin 52. Accordingly, the overmolding 22 does not cover the light emitting diode package 10, but does extend over an outer periphery of the plastic cap 50 to form a hermetic seal therewith. In some contemplated embodiments, the periphery of the plastic cap 50 distorts, is cut, or partially melts during the overmolding process to enhance sealing characteristics of the plastic cap 50.

When the lighting device is removed from the injection molding die, the annular pin 52 is removed but the plastic cap 50 remains hermetically sealed with the surrounding overmolding 22. This configuration reduces a likelihood of water or other environmental contaminants ingressing through the opening for the light emitting diode package 10 to penetrate underneath the overmolding 22 (that is, between the overmolding 22 and the surface 12 of the substrate 14).

Although not shown, in some embodiments it is contemplated to include a separate annular gasket that is placed over the periphery of the plastic cap 50. For example, an annular rubber gasket can be placed over the periphery of the plastic cap 50 to mate with the bottom of the annular isolation pin 52 during overmolding. This arrangement advantageously allows the separate annular gasket to be made of rubber or another material selected for good sealing properties respective to the pin 52. In some such embodiments, the annular gasket is secured with the periphery of the plastic cap 50 before placement over the light emitting diode package 10. For example, the securing can employ an adhesive, or the plastic cap 50 can be assembled with the separate annular gasket without adhesive, for example using ultra-sonic welding. In other embodiments, the gasket is installed first, followed by overmolding, followed by bonding of the plastic cap 50 to the portion of the gasket remaining exposed after the overmolding. Such bonding can be by ultrasonic welding, for example.

As used herein, the term "annular" means that the annular pin 52 has a central opening in which the light emitting diode package 10 is disposed, or similarly the separate annular gasket if provided has a central opening. The term "annular" is not limited to circular cross-sections or circular gaskets, but encompasses other cross-sectional configurations or gasket configurations such as square, rectangular, circular, elliptical, or otherwise-shaped inner perimeters, and square, rectangular, circular, elliptical, or otherwise-shaped outer perimeters. It is contemplated for the inner and outer cross-section perimeters to be differently shaped, such as having a square inner perimeter and a round outer perimeter.

The embodiment of FIG. 6 employs the illustrated substantially rigid plastic cap 50 to form a gasket for sealing off the interior of the isolation pin 52 during overmolding. However, a flexible or conformal plastic sheet can also be used. For example, the extended plastic sheet 30 of FIG. 1 could be applied before overmolding such that it adheres directly to the surface 12 of the substrate 14. Then, the substrate is placed into the overmolding die such that the isolation pin 52 seals against a periphery of the vinyl or acrylic sheet 30, in the same way that the substantially rigid plastic cap 50 does in the example of FIGS. 5 and 6. The overmolding then covers and hermetically seals with the periphery of the sheet 30, to form a structure similar to that of FIG. 6 but with the substantially rigid cap 50 replaced by a conformal sheet extending over the light emitting diode package 10 but under the overmolding 22.

It is to be appreciated that the various disclosed embodiments can each include other features, components, or elements. For example, a phosphor or phosphor blend can be incorporated on or in the encapsulant, or on or in the vinyl, acrylic, or other plastic sealing layer. Various optical components or features such as microlenses, roughened surfaces, or so forth can be incorporated. The light emitting chip may comprise a plurality of light emitting chips, as for example in a red-green-blue configuration including independently operable red, green, and blue light emitting chips. The lead frame or submount 16 can incorporate various features such as electrical vias, electrostatic discharge (ESD) protection components or circuitry mounted on or integrated monolithically with the lead frame or submount, or so forth.

The preferred embodiments have been illustrated and described. Obviously, modifications and alterations will occur to others upon reading and understanding the preceding detailed description. It is intended that the invention be construed as including all such modifications and alterations insofar as they come within the scope of the appended claims or the equivalents thereof.

The appended claims follow:

The invention claimed is:

1. A method of fabricating a lighting device, the method comprising:
   mounting a light emitting chip to a supporting surface of a substrate, the light emitting chip being a surface mount light emitting chip with or without an intervening submount, the substrate being configured to convey electrical power to the light emitting chip;
   overmolding at least a portion of the supporting surface of the substrate, the overmolding not covering or contacting the light emitting chip, such that a gap is created between the overmolding and the light emitting chip;
   encapsulating the light emitting chip with a silicone encapsulant; and
   sealing an assembly including at least the silicone encapsulant and the light emitting chip using a light transmissive vinyl or acrylic layer.

2. The method as set forth in claim 1, wherein the sealing comprises:
   adhering the light transmissive vinyl or acrylic layer as a unit to at least the silicone encapsulant using an intervening adhesive.

3. The method as set forth in claim 1, wherein the sealing comprises:
   disposing the light transmissive vinyl or acrylic layer as a unit over at least the silicone encapsulant.

4. The method as set forth in claim 3, wherein the encapsulant includes a top surface and two side surfaces, the sealing further comprises:
   substantially conforming the disposed unitary light transmissive vinyl or acrylic layer only to the top surface and side surfaces of the silicone encapsulant.

5. The method as set forth in claim 1, wherein
   the sealing is performed subsequent to the overmolding and comprises disposing the light transmissive vinyl or acrylic layer as a unit over at least the silicone encapsulant.

6. A method of fabricating a lighting device, the method comprising:
   mounting a light emitting chip to a supporting surface of a substrate, the light emitting chip being a surface mount light emitting chip with or without an intervening submount, the substrate being configured to convey electrical power to the light emitting chip;
   overmolding at least a portion of the supporting surface of the substrate, the overmolding not covering or contacting the light emitting chip, such that a gap is created between the overmolding and the light emitting chip;
   encapsulating the light emitting chip with an encapsulant; and
   sealing an assembly including at least the encapsulant and the light emitting chip by disposing a light transmissive plastic layer as a unit over the assembly.

7. The method as set forth in claim 6, wherein the encapsulating comprises:
   encapsulating the light emitting chip with a silicone encapsulant.

8. The method as set forth in claim 6, wherein the sealing comprises:
   adhering the light transmissive plastic layer as a unit to at least the encapsulant using an intervening adhesive.

9. The method as set forth in claim 6,
   wherein the sealing is performed subsequent to the overmolding and comprises disposing the light transmissive plastic layer as a unit over at least the encapsulant.

10. The method as set forth in claim 6, wherein the sealing comprises:
    sealing the assembly by disposing a light transmissive vinyl or acrylic layer as a unit over the assembly.

11. The method as set forth in claim 6, wherein the sealing comprises:
    sealing the assembly by disposing a light transmissive plastic layer as a unit over the assembly, the light transmissive plastic layer being selected from a group consisting of vinyl, acrylic, polycarbonate, and polyethylene.

12. The method as set forth in claim 6, wherein the sealing comprises:
    sealing the assembly by disposing an environmentally resistant light transmissive plastic layer as a unit over the assembly.

13. The method as set forth in claim 6, wherein the sealing comprises adhering a rigid plastic cap over at least the top surface and each side surface of the silicone encapsulant using an intervening adhesive.

14. The method as set forth in claim 13, wherein the sealing occurs prior to overmolding, such that the overmolding is disposed over a periphery of said plastic cap.

15. The method as set forth in claim 1, wherein said overmolding is substantially opaque.

* * * * *